US010922959B2

(12) United States Patent
Kohanek et al.

(10) Patent No.: US 10,922,959 B2
(45) Date of Patent: Feb. 16, 2021

(54) SYSTEM AND METHOD FOR SIMPLIFIED ACTIVITY BASED SETUP OF A CONTROLLING DEVICE

(71) Applicant: Universal Electronics Inc., Santa Ana, CA (US)

(72) Inventors: Jeffrey Kohanek, Westminster, CA (US); Ramzi Ammari, Newport Coast, CA (US)

(73) Assignee: Universal Electronics Inc., Santa Ana, CA (US)

( * ) Notice: Subject to any disclaimer, the term of this patent is extended or adjusted under 35 U.S.C. 154(b) by 16 days.

(21) Appl. No.: 16/254,810

(22) Filed: Jan. 23, 2019

(65) Prior Publication Data

US 2019/0213869 A1 Jul. 11, 2019

Related U.S. Application Data

(63) Continuation of application No. 12/632,927, filed on Dec. 8, 2009, now Pat. No. 10,198,935.

(51) Int. Cl.
*G08C 17/02* (2006.01)
*H04L 17/02* (2006.01)
(Continued)

(52) U.S. Cl.
CPC ............ *G08C 17/02* (2013.01); *G08C 19/00* (2013.01); *G08C 2201/92* (2013.01); *G09G 5/00* (2013.01); *H03M 11/00* (2013.01); *H04L 17/02* (2013.01)

(58) Field of Classification Search
None
See application file for complete search history.

(56) References Cited

U.S. PATENT DOCUMENTS 4,959,810 A 9/1990 Darbee et al.
5,204,768 A 4/1993 Tsakiris et al.
(Continued)

FOREIGN PATENT DOCUMENTS

WO 02073566 A2 9/2002
WO 2011/041339 A1 4/2011

OTHER PUBLICATIONS

The Int. Bureau of WIPO, International Preliminary Report on Patentability of PCT Application No. US10/59199, dated Jun. 21, 2012, 7 pgs.
(Continued)

*Primary Examiner* — Mohammad Ali
*Assistant Examiner* — Kelvin Booker
(74) *Attorney, Agent, or Firm* — Greenberg Traurig, LLP

(57) ABSTRACT

A controlling device having an activity mode corresponding to a controllable activity in which activation of a command key within a logical group of command keys of the controlling device causes a transmission of command data to control one or more functional operations of an intended target appliance. For a controllable activity the controlling device has a memory in which is stored a plurality of predetermined appliance to logical group of command keys mappings. To configure the controlling device for the controllable activity one or more predetermined keys of the controlling device are activated to thereby designate one or more intended target appliances for the controllable activity. When the controlling device is then placed into the activity mode corresponding to the controllable activity, the controlling device will use the configuration to select one of the plurality of predetermined appliance to logical group of command keys mappings to determine which appliance command data to transmit in response to an activation of a command key within a logical group of command keys.

15 Claims, 8 Drawing Sheets

(51) Int. Cl.
*H03M 11/00* (2006.01)
*G09G 5/00* (2006.01)
*G08C 19/00* (2006.01)

(56) References Cited

U.S. PATENT DOCUMENTS

| | | |
|---|---|---|
| 5,481,256 A | 1/1996 | Darbee et al. |
| 5,614,906 A | 3/1997 | Hayes et al. |
| 5,959,751 A | 9/1999 | Darbee et al. |
| 6,014,092 A | 1/2000 | Darbee et al. |
| 6,157,319 A | 12/2000 | Johns et al. |
| 6,195,033 B1 | 2/2001 | Darbee et al. |
| 6,225,938 B1 | 5/2001 | Hayes et al. |
| 6,597,374 B1 * | 7/2003 | Baker ............... H03J 1/0025 345/173 |
| 6,640,144 B1 | 10/2003 | Huang et al. |
| 6,747,591 B1 | 6/2004 | Lilleness et al. |
| 6,784,805 B2 | 8/2004 | Harris et al. |
| 6,909,378 B1 | 6/2005 | Larnbrechts et al. |
| 6,947,101 B2 | 9/2005 | Arling |
| 6,998,955 B2 | 2/2006 | Ballew et al. |
| 7,013,434 B2 * | 3/2006 | Masters ............ G08C 17/00 386/234 |
| 7,027,881 B2 | 4/2006 | Yumoto et al. |
| 7,127,305 B1 | 10/2006 | Palmon |
| 7,136,709 B2 | 11/2006 | Arling et al. |
| 7,260,604 B2 | 8/2007 | Kuki |
| 7,412,653 B2 | 8/2008 | Gates |
| 7,471,281 B2 | 12/2008 | Masters et al. |
| 7,610,555 B2 | 10/2009 | Klein et al. |
| 7,813,822 B1 | 10/2010 | Hoffberg |
| 7,869,824 B2 | 1/2011 | Min |
| 7,908,019 B2 | 3/2011 | Ebrom et al. |
| 7,937,171 B2 | 5/2011 | Glotzbach et al. |
| 7,941,821 B2 | 5/2011 | Stecyk et al. |
| 7,954,126 B2 | 5/2011 | Stecyk et al. |
| 8,051,381 B2 | 11/2011 | Ebrom et al. |
| RE43,139 E | 1/2012 | Lee |
| 8,198,988 B2 | 6/2012 | Hardacker et al. |
| 9,071,329 B2 | 6/2015 | Escobosa et al. |
| 9,357,252 B2 | 5/2016 | Kohanek |
| 2003/0088670 A1 | 5/2003 | Wang |
| 2003/0095156 A1 | 5/2003 | Klein et al. |
| 2003/0103088 A1 | 6/2003 | Dresti et al. |
| 2003/0117427 A1 | 6/2003 | Haughawout et al. |
| 2003/0120831 A1 * | 6/2003 | Dubil ................ G08C 17/00 710/8 |
| 2004/0056789 A1 * | 3/2004 | Arling ............... H04B 1/202 341/176 |
| 2004/0070491 A1 | 4/2004 | Huang et al. |
| 2004/0090461 A1 | 5/2004 | Adams |
| 2004/0172648 A1 | 9/2004 | Xu et al. |
| 2004/0179142 A1 | 9/2004 | Fang |
| 2004/0189508 A1 | 9/2004 | Nguyen |
| 2005/0033887 A1 | 2/2005 | Kim et al. |
| 2005/0062636 A1 * | 3/2005 | Conway, Jr. ......... G08C 17/00 341/176 |
| 2005/0066370 A1 * | 3/2005 | Alvarado ............ G08C 17/00 725/80 |
| 2005/0094610 A1 | 5/2005 | de Clerq et al. |
| 2005/0114901 A1 | 5/2005 | Yui et al. |
| 2005/0216843 A1 * | 9/2005 | Masters ............. G08C 17/00 715/740 |
| 2005/0280558 A1 | 12/2005 | McLeod |
| 2006/0033636 A1 | 2/2006 | Kwong et al. |
| 2006/0066716 A1 | 3/2006 | Chang |
| 2006/0192653 A1 * | 8/2006 | Atkinson ............. G06F 21/88 340/5.61 |
| 2006/0259864 A1 | 11/2006 | Klein et al. |
| 2007/0037522 A1 | 2/2007 | Liu et al. |
| 2007/0042767 A1 | 2/2007 | Stepanian |
| 2007/0052547 A1 * | 3/2007 | Haughawout ........ H04N 5/4403 340/4.31 |
| 2007/0225828 A1 | 9/2007 | Huang et al. |
| 2008/0109734 A1 | 5/2008 | Castagno |
| 2008/0111727 A1 | 5/2008 | Kim |
| 2009/0047022 A1 | 2/2009 | Newman et al. |
| 2009/0245804 A1 | 10/2009 | Garner et al. |
| 2009/0292375 A1 | 11/2009 | Thompson et al. |
| 2009/0327887 A1 | 12/2009 | Argue et al. |
| 2010/0004764 A1 | 1/2010 | Ebrom et al. |
| 2010/0013695 A1 | 1/2010 | Hong et al. |
| 2010/0045490 A1 | 2/2010 | Odell et al. |
| 2010/0071019 A1 | 3/2010 | Blanchard et al. |
| 2010/0085209 A1 | 4/2010 | Teuling et al. |
| 2010/0123613 A1 | 5/2010 | Kohanak et al. |
| 2010/0149017 A1 | 6/2010 | Besshi et al. |
| 2010/0235285 A1 | 9/2010 | Hoffberg |
| 2010/0245134 A1 | 9/2010 | Black et al. |
| 2010/0317420 A1 | 12/2010 | Hoffberg |
| 2010/0332979 A1 | 12/2010 | Xu et al. |
| 2011/0102158 A1 | 5/2011 | Haughawout et al. |
| 2011/0137430 A1 * | 6/2011 | Kohanek ............. G08C 17/02 700/17 |
| 2012/0194326 A1 | 8/2012 | Kazama et al. |
| 2013/0002558 A1 | 1/2013 | Ho et al. |
| 2013/0127636 A1 * | 5/2013 | Aryanpur ........... G08C 19/00 340/870.07 |
| 2013/0147612 A1 | 6/2013 | Hong et al. |
| 2013/0249677 A1 | 9/2013 | Kohanek et al. |
| 2014/0091912 A1 * | 4/2014 | Lazarro ............. G08C 19/00 340/12.52 |
| 2014/0210755 A1 | 7/2014 | Jung et al. |
| 2015/0010167 A1 | 1/2015 | Arling |
| 2015/0059086 A1 * | 3/2015 | Clough ............. G08C 17/02 5/83.1 |
| 2016/0104371 A1 * | 4/2016 | Selfe ............... G08C 17/02 340/4.32 |
| 2017/0092117 A1 | 3/2017 | Huang et al. |
| 2018/0261079 A1 | 9/2018 | Huang et al. |

OTHER PUBLICATIONS

European Patent Office, Supplementary European Search Report of EP Application No. 10836502, received Mar. 20, 2013, 8 pgs.

* cited by examiner

|     |     |     |     | 710 | 712 | 714 | 716 | 720 | 722 | 724 | 726 | 728 |

| Appliance participation | | | | Key group assignments | | | | |
|---|---|---|---|---|---|---|---|---|
| TV | STB | Audio | DVD | Volume | Channel | Transport | Navigation | Other |
| x | 1 | 0 | x | TV | STB | STB | STB | TV |
| x | 1 | 1 | x | Audio | STB | STB | STB | Audio |
| x | 0 | 1 | x | Audio | TV | TV | TV | Audio |
| x | 0 | 0 | x | TV | TV | TV | TV | TV |

1 = registered, 0 = not registered, x = "Don't care"

Key assignments for activity "Watch TV"

Figure 7a

| Appliance participation | | | | Key group assignments | | | | |
|---|---|---|---|---|---|---|---|---|
| TV | STB | Audio | DVD | Volume | Channel | Transport | Navigation | Other |
| x | 1 | 0 | 0 | TV | STB | STB | STB | TV |
| x | 1 | 1 | 0 | Audio | STB | STB | STB | Audio |
| x | x | 1 | 1 | Audio | DVD | DVD | DVD | Audio |
| x | 0 | 0 | 1 | TV | DVD | DVD | DVD | TV |
| x | 0 | 0 | 0 | TV | TV | TV | TV | TV |

1 = registered, 0 = not registered, x = "Don't care"

Key assignments for activity "Watch a movie"

Figure 7b

Key assignments for activity "Listen to Music"

SYSTEM AND METHOD FOR SIMPLIFIED ACTIVITY BASED SETUP OF A CONTROLLING DEVICE

RELATED APPLICATION INFORMATION

This application claims the benefit of and is a continuation of U.S. application Ser. No. 12/632,927, filed on Dec. 8, 2009, the disclosure of which is incorporated herein by reference in its entirety.

BACKGROUND

This invention relates generally to controlling devices, such as for example universal remote controls, and more specifically to systems and methods for configuration of such controlling devices, by way of general example, to match such controlling devices to appliances to be controlled, to define favorite channels, etc., and to provide methods for a user to rapidly and conveniently program activity-based configuration parameters for use in such controlling devices.

Today, even simple home entertainment systems may comprise multiple appliances such as for example a TV set, a cable and/or satellite box, an AV receiver, a DVD player, etc. While use of a universal controlling device to consolidate system control functionality into a single user interface is common in such systems, a recognized disadvantage of the basic form of such controlling devices is the requirement for a user to continually switch the controlling device operational mode back and forth between appliances to be controlled during set up and operation of the equipment. Accordingly various improvements to such basic universal controlling devices have been proposed, such as for example provision for macro commands (user pre-programmed sequences of operation, typically initiated via single button press) as described in U.S. Pat. No. 5,959,751, or user re-programming of appliance commands to function across controlling device operational modes such as described in U.S. Pat. No. 6,195,033. More recently, "activity" or task based universal controlling devices such as described in U.S. Pat. No. 6,784,805 have been introduced, in which controlling device key layouts, macro sequences, etc., are organized around user activities such as watching TV or listening to music rather than by individual appliances to be controlled. However, all of these methods necessitate considerable user interaction to initially configure the controlling device to operate as desired, performed on the remote itself, on an associated programming device such as a personal computer, or some combination thereof.

SUMMARY OF THE INVENTION

In accordance with the teachings of this invention, a universal controlling device may be provisioned with keys for selecting designated activities such as "Watch TV," "Watch as movie," etc. In order to configure the controlling device for each of the activities, a simple series of keystrokes by a user may register those appliances which participate in that activity. Thereafter, upon selection of that activity key and entry of the controlling device into the corresponding activity mode, the controlling device may configure itself with a pre-programmed power macro sequence and a predetermined function key command mapping, both derived from the appliance registrations provided by the user. By way of example, if a user registers only a TV and a set top box for the activity "Watch TV," then while that activity is selected the volume control keys of the controlling device may transmit commands in a format recognizable by the TV appliance. However, if the user additionally registers an AV receiver for the "Watch TV" activity, then while that activity is selected the volume control keys of the controlling device may transmit commands in a format recognizable by the AV receiver. In addition, while an activity is selected, actuation of the "power" key of the controlling device will cause the sequential transmission of the each of the individual power commands of all the appliances registered for that activity, i.e., the controlling device will provide single-key power up and/or power down of all equipment required for that activity. In this manner, a simplified user input may be substituted for what would otherwise be a complex series of controlling device programming interactions.

A better understanding of the objects, advantages, features, properties and relationships of the invention will be obtained from the following detailed description and accompanying drawings which set forth illustrative embodiments and which are indicative of the various ways in which the principles of the invention may be employed.

BRIEF DESCRIPTION OF THE DRAWINGS

For a better understanding of the various aspects of the invention, reference may be had to preferred embodiments shown in the attached drawings in which:

FIGS. 7a through 7c illustrate exemplary command key mappings for use in configuring a controlling device in accordance with the methods illustrated in FIG. 6.

DETAILED DESCRIPTION

Figure 1:
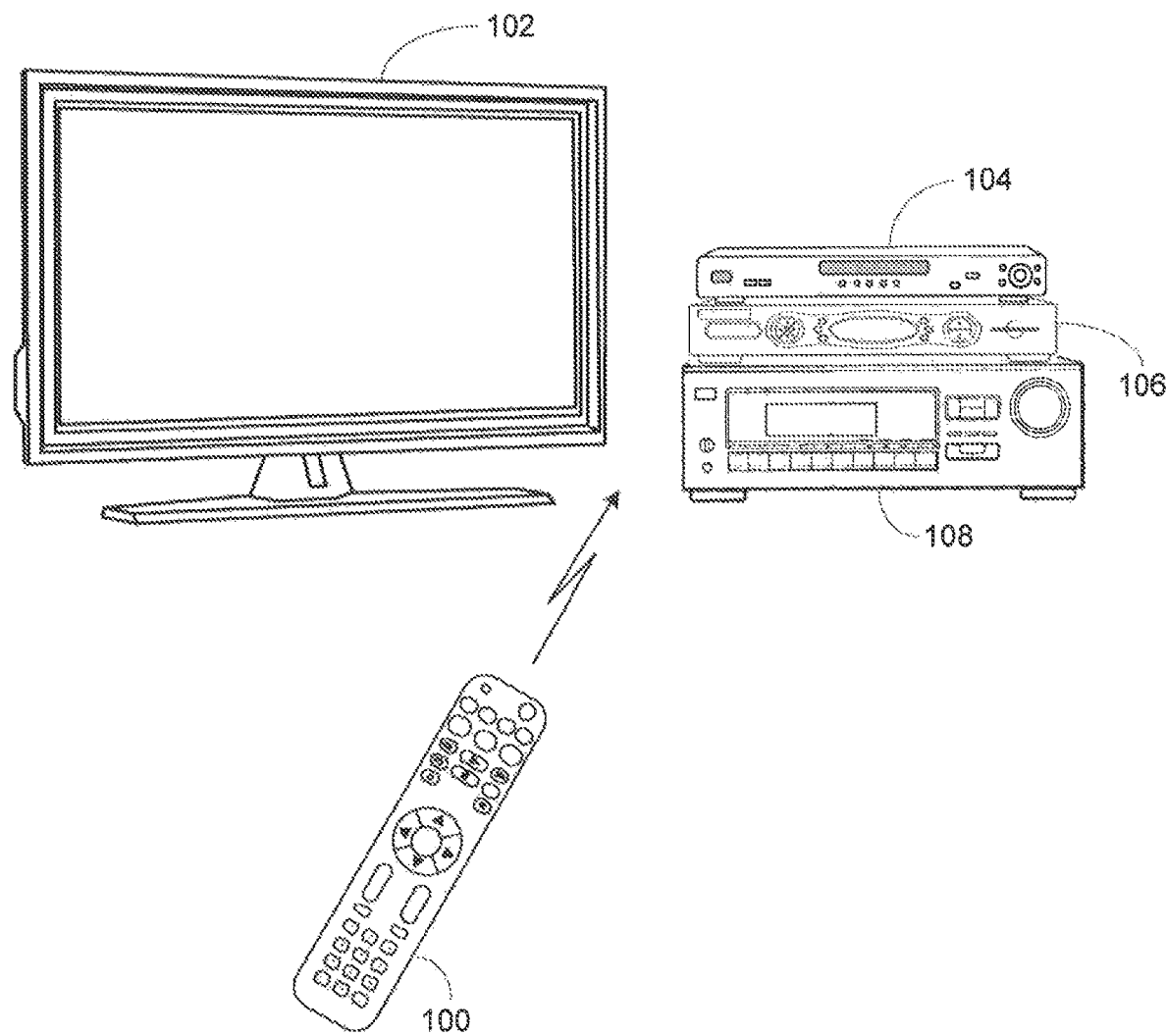
FIG. 1 illustrates an exemplary system in which the methods of the instant invention may be practiced.

Turning now to FIG. 1, there is illustrated an exemplary system in which a controlling device 100 is configured to control various controllable appliances, such as a television 102, a DVD player 104, a set top box ("STB") 106, and an AV receiver 108. As is known in the art, the controlling device 100 maybe capable of transmitting commands to the appliances, using any convenient IR, RF, Point-to-Point, or networked protocol, to cause the appliances to perform operational functions. While illustrated in the context of a television 102, DVD player 104, STB 106 and AV receiver 108, it is to be understood that controllable appliances may include, but need not be limited to, televisions, VCRs, DVRs, DVD players, cable or satellite converter set-top boxes ("STBs"), amplifiers, CD players, game consoles, home lighting, drapery, fans, HVAC systems, thermostats, personal computers, etc. In an illustrative embodiment controlling device 100 may be further adapted to permit a user to rapidly and conveniently configure controlling device 100 and/or appliances 102 thru 108 for use in various activities such as for example, watching TV, listening to music, etc., as will be further described hereafter.

Figure 2:
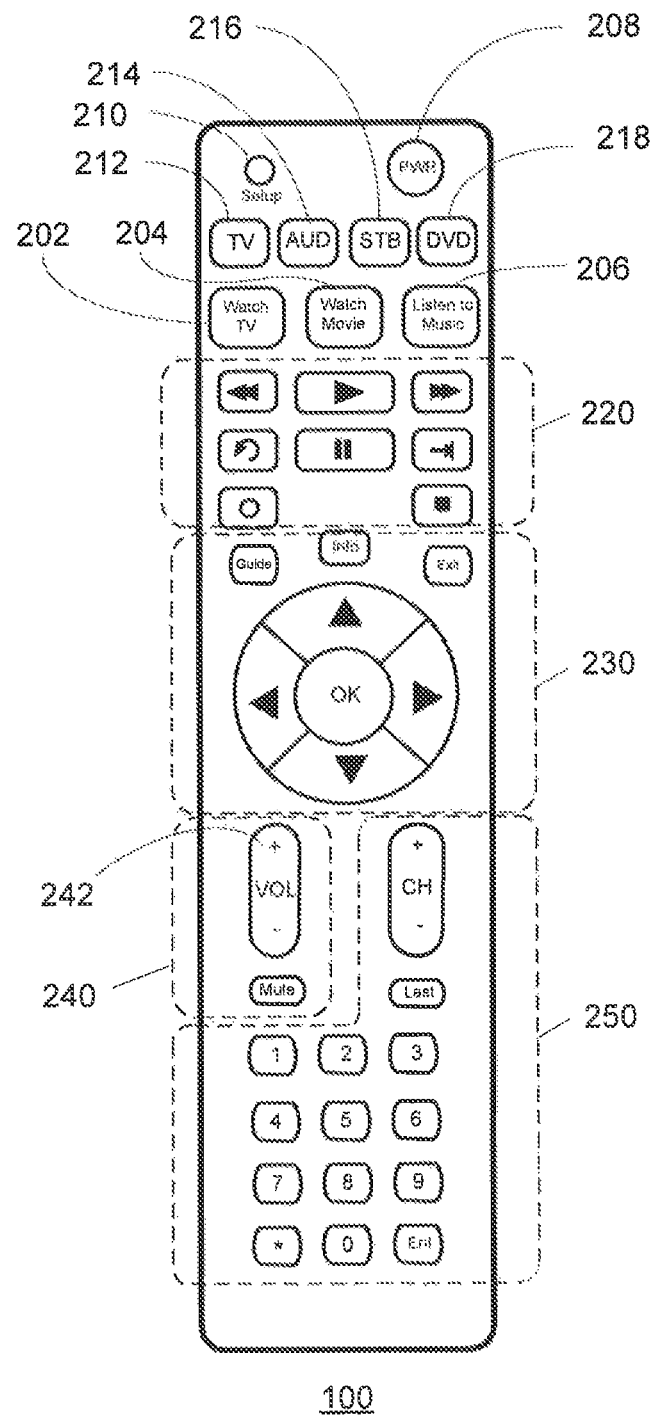
FIG. 2 further illustrates an exemplary controlling device of the system of FIG. 1.

With reference to FIG. 2, appliance commands made available for transmission from controlling device 100 by way of user interaction with physical buttons, touch sensitive display screens, gesture input pads, etc. (all hereafter referred to as "keys") may include logical groups of command functions, such as by way of example, command functions to be transmitted by way of user interaction with command function keys 220 related to playback of media; command function keys 230 related to navigation of guides, menus, etc.; command function keys 240 related to volume control; and command function keys 250 related to channel selection. In some embodiments, additional logical groups of command functions (not illustrated), for example related to input selection, may also be available. In addition, controlling device 100 may include appliance selection keys 212, 214, 216, 218 for selecting an appliance to be controlled, as well as a power key 208 for transmitting power commands and a setup key 210 for initiating setup of controlling device function and features. Since the operation and functionality of such controlling device keys is well know in the art, these will not described further herein except where necessary for an understanding of the inventive methods described herein.

In an illustrative embodiment of the instant invention, controlling device 100 may be further equipped with a group of activity selection keys 202, 204, 206 for use in initiating configuration of controlling device 100 and/or controlled appliances 102, 104, 106, 108 in accordance with a user's currently desired activity, as will be described in greater detail hereafter. As will also become apparent, when the controlling device is placed into an activity mode corresponding to a controllable activity by means of a user interaction with an activity selection key activations of keys within the logical groups of command keys of the controlling device (e.g., channel control, volume control, etc.) will cause a transmission of command data to control one or more functional operations of an intended target appliance that is associated with each logical group of command keys of the controlling device (e.g., STB, TV, etc.)

Figure 3:
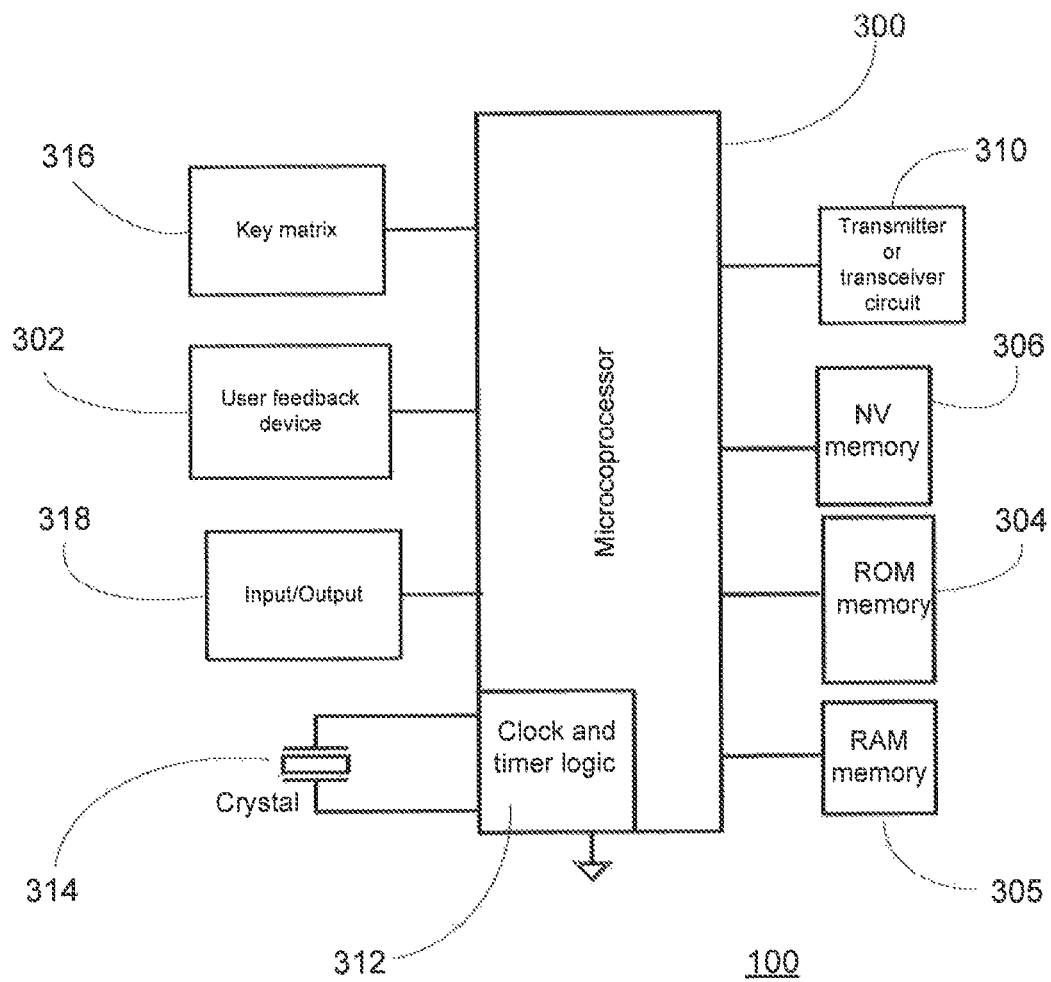
FIG. 3 illustrates a block diagram of exemplary components of the exemplary controlling device of FIG. 2.

Turning now to FIG. 3, for use in commanding the functional operations of one or more appliances, the controlling device 100 may include, as needed for a particular application, a processor 300 coupled to a ROM memory 304, a RAM memory 305, a key matrix 316 (e.g., hard keys, soft keys such as a touch sensitive surface overlaid on a liquid crystal (LCD), and/or an electroluminescent (EL) display), transmission circuit(s) and/or transceiver circuit(s) 310 (e.g., IR and/or RF), a non-volatile read/write memory 306, a means 302 to provide feedback to the user (e.g., one or more LEDs, illuminable keys, display, speaker, and/or the like), an input/output port 318 such as a serial interface, USB port, modem, Zigbee, WiFi, or Bluetooth transceiver, etc., and clock and timer logic 312 with associated crystal or resonator 314.

As will be understood by those skilled in the art, some or all of the memories 304, 305, 306 may include executable instructions (collectively, the controlling device program memory) that are intended to be executed by the processor 300 to control the operation of the remote control 100, as well as data which serves to define to the operational software the necessary control protocols and command values for use in transmitting command signals to controllable appliances (collectively, the command data). In this manner, the processor 300 may be programmed to control the various electronic components within the remote control 100, e.g., to monitor the key matrix 316, to cause the transmission of signals, etc. The non-volatile read/write memory 306, for example an EEPROM, battery-backed up RAM, FLASH, Smart Card, memory stick, or the like, may additionally be provided to store setup data and parameters as necessary. While the memory 304 is illustrated and described as a ROM memory, memory 304 can also be comprised of any type of readable media, such as ROM, FLASH, EEPROM, or the like. Preferably, the memories 304 and 306 are non-volatile or battery-backed such that data is not required to be reloaded after battery changes. In addition, the memories 304, 305 and 306 may take the form of a chip, a hard disk, a magnetic disk, an optical disk, and/or the like. Still further, it will be appreciated that some or all of the illustrated memory devices may be physically combined (for example, a single FLASH memory may be logically partitioned into different portions to support the functionality of memories 304 and 306 respectively), and/or may be physically incorporated within the same IC chip as the microprocessor 300 (a so called "microcontroller") and, as such, they are shown separately in FIG. 3 only for the sake of clarity.

To cause the controlling device 100 to perform an action, the controlling device 100 is adapted to be responsive to events, such as a sensed user interaction with the key matrix 316, etc. In response to an event, appropriate instructions within the program memory (hereafter the "controlling device operating program") may be executed. For example, when a command function key is actuated on the controlling device 100, the controlling device 100 may retrieve from the command data stored in memory 304, 305, 306 a command value and control protocol corresponding to the actuated function key and, where necessary, current device mode and transmit that command to an intended target appliance, e.g., STB 106, in a format recognizable by that appliance to thereby control one or more functional operations of that appliance. It will be appreciated that the controlling device operating program can be used not only to cause the transmission of commands and/or data to the appliances, but also to perform local operations. While not limiting, local operations that may be performed by the controlling device 100 may include displaying information/data, favorite channel setup, macro key setup, function key relocation, etc. Examples of local operations can be found in U.S. Pat. Nos. 5,481,256, 5,959,751, and 6,014,092.

For selecting sets of command data to be associated with the appliances to be controlled data may be provided to controlling device 100 that serves to identify each intended target appliance by its make, and/or model, and/or type. Such data allows the controlling device 100 to identify the appropriate command data sets within a library of command data that are to be used to transmit recognizable commands in formats appropriate for such identified appliances. Such a library of command data may be preprogrammed in controlling device 100, downloaded into controlling device 100 as part of the setup process, or a combination thereof. The library of command data may represent a plurality of controllable appliances of different types and manufacture, a plurality of controllable appliances of the same type but different manufacture, a plurality of appliances of the same manufacture but different type or model, etc., or any combination thereof as appropriate for a given embodiment. In certain embodiments, the data used to identify an appropriate command data set may take the form of a numeric setup code (obtained, for example, from a printed list of manufacturer names and/or models with corresponding code numbers, from a support Web site, etc.) which may be entered via activation of those keys that are also used to cause the transmission of commands to an appliance, preferably those keys that are labeled with numerals.

Alternative appliance setup procedures known in the art include scanning bar codes, RFID tags, or other indicia; sequentially transmitting a predetermined command in different formats until a target appliance response is detected; interaction with a Web site culminating in downloading of command data and/or setup codes to the controlling device, etc. Since such methods for setting up a controlling device to command the operation of specific home appliances are well-known, these will not be described in greater detail herein. Nevertheless, for additional information pertaining to setup procedures, the reader may turn, for example, to U.S. Pat. No. 4,959,810, 5,614,906, or 6,225,938 or to pending U.S. patent application Ser. No. 11/515,962, all of like assignee and all incorporated herein by reference in their entirety.

In an illustrative embodiment, the operating program of controlling device 100 may additionally support single-key configuration of controlling device 100 and/or controlled appliances 102, 104, 106, 108 for use in various user activities, via a series of designated activity selection keys, for example "Watch TV" 202, "Watch Movie" 204, or "Listen to Music" 206. In a preferred embodiment, a simplified method for setting up the desired activity configurations may also be provided, as will now be described in conjunction with FIGS. 4 and 5. In the illustrative embodiment, a user may initiate a setup state 500 for example by holding setup key 210 down for three seconds. Once the setup state is initiated, at steps 502, 504, 506 the controlling device operating program may wait for a predetermined period of time, for example 30 seconds, for another key to be activated. If no key is activated during that timeout period, the controlling device operating program may exit the setup state with no further action. If a next key, which is not one of the activity selection keys 202, 204, 206, is activated at step 508 during the timeout period the indicated other setup operation is performed, for example appliance setup or programming of local operations, as is well known in the art and described, for example, in the previously referenced U.S. Pat. No. 4,959,810. If however the next key activated during the timeout period is an activity selection key, for example "Watch TV" 202, this may indicate that a user wishes to configure that activity and at step 509 the controlling device operating program may cause the indicated key to be illuminated by way of confirmation as illustrated for example at 202' in FIG. 4. It will be appreciated that various alternative methods for entering into an activity configuration state are also possible, for example holding down a desired activity selection key for a predetermined period of time.

At step 510, the controlling device operating program may prepare for activity configuration input by initializing any previous configuration settings for the selected activity. Such initialization may take the form of clearing all configuration settings, establishing default settings, or a combination thereof depending on the particular embodiment. In the event default settings are established, this step may also include illuminating any of the appliance selection keys 212, 214, 216, 218 which correspond to appliances which are pre-configured as participating in the activity. Thereafter, at steps 512-518, the controlling device operating program may wait for a predetermined period of time, for example 15 seconds, for a further key to be activated. If no further key is activated during that timeout period, at steps 520-524 any existing settings for the indicated activity are cleared, key illumination is extinguished, and the controlling device operating program exits the setup state. If at step 512 it is determined by the controlling device operating program that a not already illuminated, i.e., user selected or preselected, appliance selection key, such as for example "TV" 212, has been activated, at step 526 the appliance selection key may be illuminated by way of confirmation, as illustrated for example at 212' in FIG. 4, and thereafter at step 528 that appliance is registered as being included in the activity, as will be described in further detail hereafter. If any function key other than an activity selection or appliance selection key is activated as determined by step 514, in certain embodiments these keystrokes may be recorded by the controlling device operating program as a macro sequence to be executed upon future activation of that activity key. Since the recording and playback of such macro sequences is well known the art, this aspect of the illustrative embodiment will not be discussed in further detail herein, however for additional information regarding such features reference may be made to for example U.S. Pat. No. 5,959,751, of like assignee and incorporated by reference herein in its entirety. These sequences of steps 512, 526, 528 or 512, 514, 520 may be repeated as often as necessary to fully characterize an activity, adding appliances such as for example STB 106 as illustrated at 216' in FIG. 4 and/or additional commands to a macro sequence. Finally, when an activity selection key is activated as determined at step 516, if the activity selection key is determined at step 517 to be that activity which is currently being configured, the controlling device operating program may interpret this as a signal to exit the activity setup state via steps 522 and 524. If it is determined to be a different activity selection key, this may be interpreted by the controlling device operating program as a request to end configuration of the current activity and commence configuration of a new activity, i.e., to return to step 509 after extinguishing the key illumination representative of the current configuration at step 526.

Figure 4:
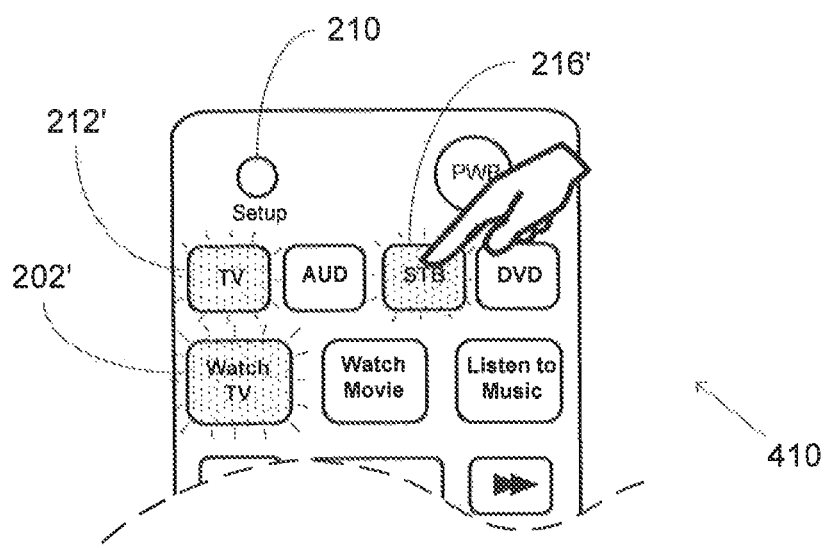
FIG. 4 illustrates a user interaction with the exemplary controlling device in order to register appliances which are to participate in a particular activity, together with an illustration of exemplary resultant registration data.
Figure 5:
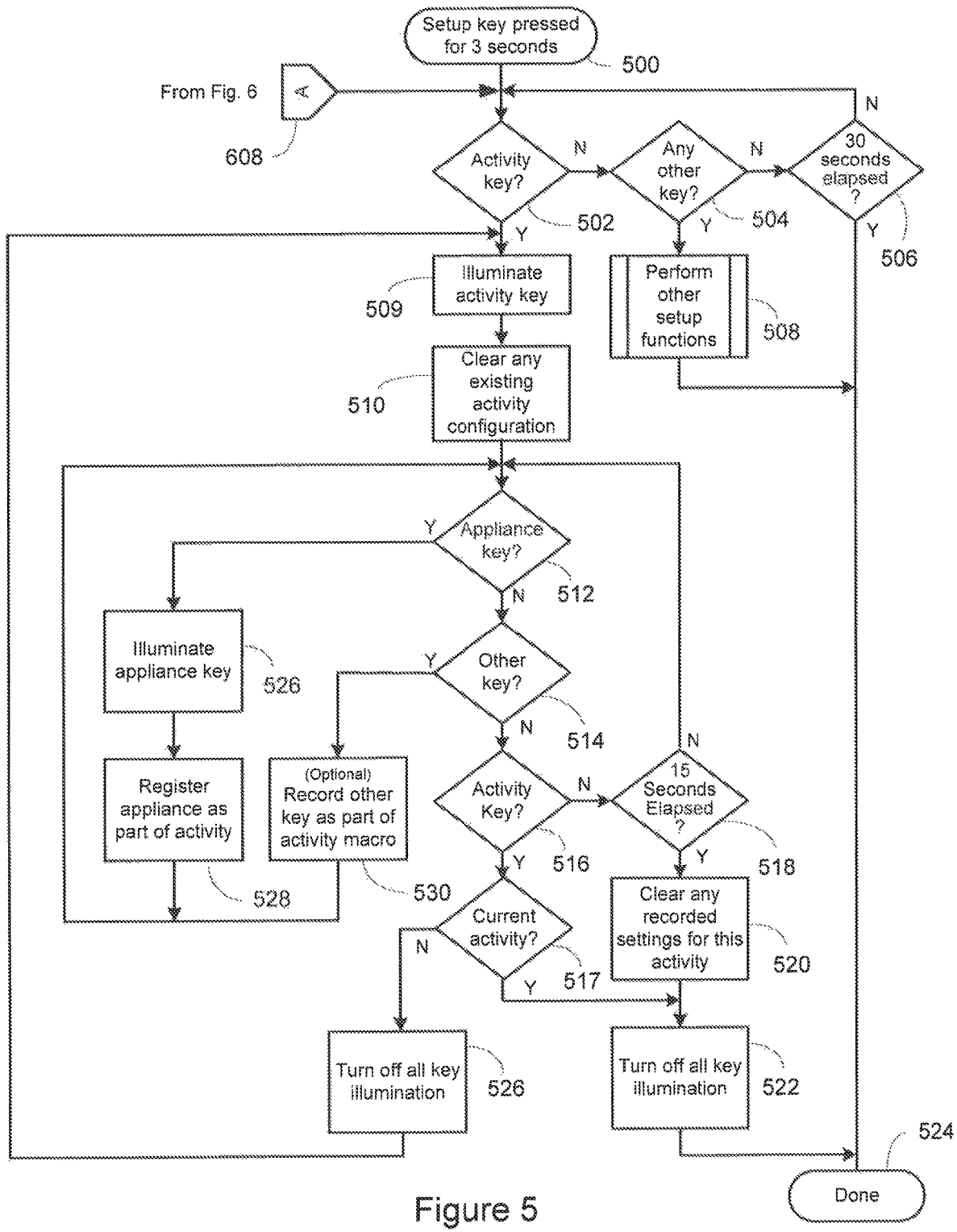
FIG. 5 illustrates an exemplary appliance registration method, in flowchart form.

Registration of the appliances participating in each activity may be performed by the controlling device operating program using a table 400 such as illustrated in FIG. 4. Such a table may comprise a series of entries 402, 404, 406 each corresponding to one of the possible activities which may be selected via the activity selection keys 202, 204, 206. In an illustrative embodiment, such table entries may comprise binary values, i.e., with possible values "1" or "0". During initialization of an activity configuration as contemplated for example at step 510 above, all the table entries corresponding to that activity may be set to a predetermined value representative of an appliance which is not participating in the activity, for example "0". Alternatively, in some embodiments, certain table entries may be pre-initialized to indicate that an appliance is participating in an activity by default, for example for a "Watch TV" activity the table entry corresponding to the TV appliance may be pre-initialized to a value that is representative of an appliance which is registered to participate in that activity, for example "1." Thereafter, as a user selects appliances to be registered as participating in that activity, as contemplated at step 528 above, the corresponding entries in table 400 may be changed to a value representative of an appliance which is registered to participate in that activity, for example "1." In this manner, table 400 may be configured to represent a map of appliances registered for use in each of the various activities. By way of detailed example, it can be seen that the appliance mapping of table row 402 corresponding to the activity "Watch TV" matches the user input and key illuminations illustrated at 410, that is sequential activation of keys 202', 212', and 216' during setup mode. While not illustrated, it will also be appreciated that the system may use a user selection of an already selected/illuminated key to cause a removal of the corresponding appliance from the activity table 400, e.g., setting an appliance entry for an activity to "0," during an activity setup operation. In certain circumstances, a user might also be prevented from deselecting an appliance that has been preselected for use in an activity during the setup process, i.e., selecting such an appliance selection key during the setup process will not cause a deillumination or deselection of the appliance for the corresponding activity.

The actions of an exemplary controlling device 100 when executing an activity selection key initiated configuration for use in an activity will now be described in conjunction with FIG. 6. Upon detection of a key activation 600, the controlling device operating program may first test if the activated key is "Setup" 210. If so, at steps 604 through 606 the controlling device operating program tests to determine if the setup key has been continuously activated for three seconds or more. If so, processing continues at 608, i.e., as previously described in conjunction with FIG. 5. If the activated key is not "Setup," at step 610 the controlling device operating program next determines if the key was one of the appliance selection keys 212 through 218. If so, at step 612 the indicated appliance mode is set as is known in the art, i.e., the controlling device is configured to transmit commands in a format appropriate for the appliance brand and model which has been identified during appliance setup as corresponding to that key. If not an appliance selection key, at step 614 the controlling device operating program may next determine if the key was one of the activity selection keys 202 through 206. If so at step 616 it is next determined if the activated activity selection key corresponds to a currently active activity mode. If so, this may be interpreted as a user request to end that activity, and at step 622 the existing activity mode is cleared. If however no activity mode is currently active, or the requested activity is different than the currently active activity, at step 618 the activity corresponding to the activated key is set as the new current activity mode, i.e., the remote control enters into an activity mode corresponding to the activated activity selection key. In some embodiments, any macro sequence which has been associated with that activity may also be executed at step 620.

If the activated key is none of setup, appliance selection, or activity selection, the controlling device operating program next determines at step 624 if an activity state is currently active. If not, the key is processed in the conventional manner at steps 632 and 634, i.e., command data corresponding to the current appliance mode is retrieved from the command data library and transmitted to the target appliance. If an activity is currently active, i.e., the controlling device is in activity mode, the controlling device operating program next determines if the activated key was the power key 208. If so a "power" sequence is transmitted to the target appliances, comprising a succession of individual power commands for each of the appliances registered for that activity, as determined for example by registration entries in the table 400 illustrated in FIG. 4. By way of detailed example, if in the exemplary embodiment the "Watch Movie" activity is currently set as active (via prior activation of the "Watch Movie" key 204), then activation of power key 208 would result in the transmission of "TV power," followed by "Audio power," followed by "DVD power" as determined for example by the entries in row 404 of table 400.

Figure 7C:
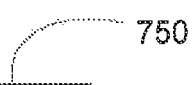

When an activity is set as currently active, processing of function keys other than "power" is performed at steps 630 and 634 and comprises retrieving and transmitting appliance command data which is appropriate for the key activated, the current activity, and the intended target appliances registered as participants in, i.e., assigned to, that activity. In an illustrative exemplary embodiment, the assignment of such commands to target appliances may be predetermined as illustrated in FIGS. 7a through 7c. With reference to FIG. 7a, a table 700 of command assignments for the activity "Watch TV" may comprise rows 702 through 708 representative of various combinations of appliance registrations as represented by the entries in columns 710 through 716 together with logical command group assignments to appliances (e.g., predetermined appliance to logical group of command keys mappings which indicate appliances to which commands are to be sent in response to activations of keys within the logical key groups 220, 230, 240, and 250) as represented by the entries in columns 720 through 728. Similar tables may be defined for each activity to be configured, for example table 740 of FIG. 7b for "Watch a Movie" and table 750 of FIG. 7c for "Listen to Music".

More particularly, returning to FIG. 7a, columns 720 through 728 of table 700 may each correspond to a logical command function group, for example column 720 may correspond to the volume control logical key function group 240, column 722 may correspond to the channel section logical key function group 250, column 724 may correspond to the playback control logical key function group 220, column 726 may correspond to the navigation control logical key function group 230, etc. The matrix formed by the intersection of columns 720 through 728 with rows 702 through 704 may then contain the appliance command function assignments corresponding to the various combinations of registered appliances. For example, when the audio appliance is not registered as participating in the "Watch TV" activity as indicated by a "0" in column 714 at row positions 702 and 708, volume group commands will be directed to the TV device as indicated by the entries located in matrix cells located at column 720 rows 702 and 708. However, when the audio appliance is registered as participating in the "Watch TV" activity as indicated by a "1" in column 714 at row positions 704 and 706, then volume group commands will be directed to the audio appliance device as indicated by the entries located in matrix cells column 720 rows 704 and 706.

Figure 6:
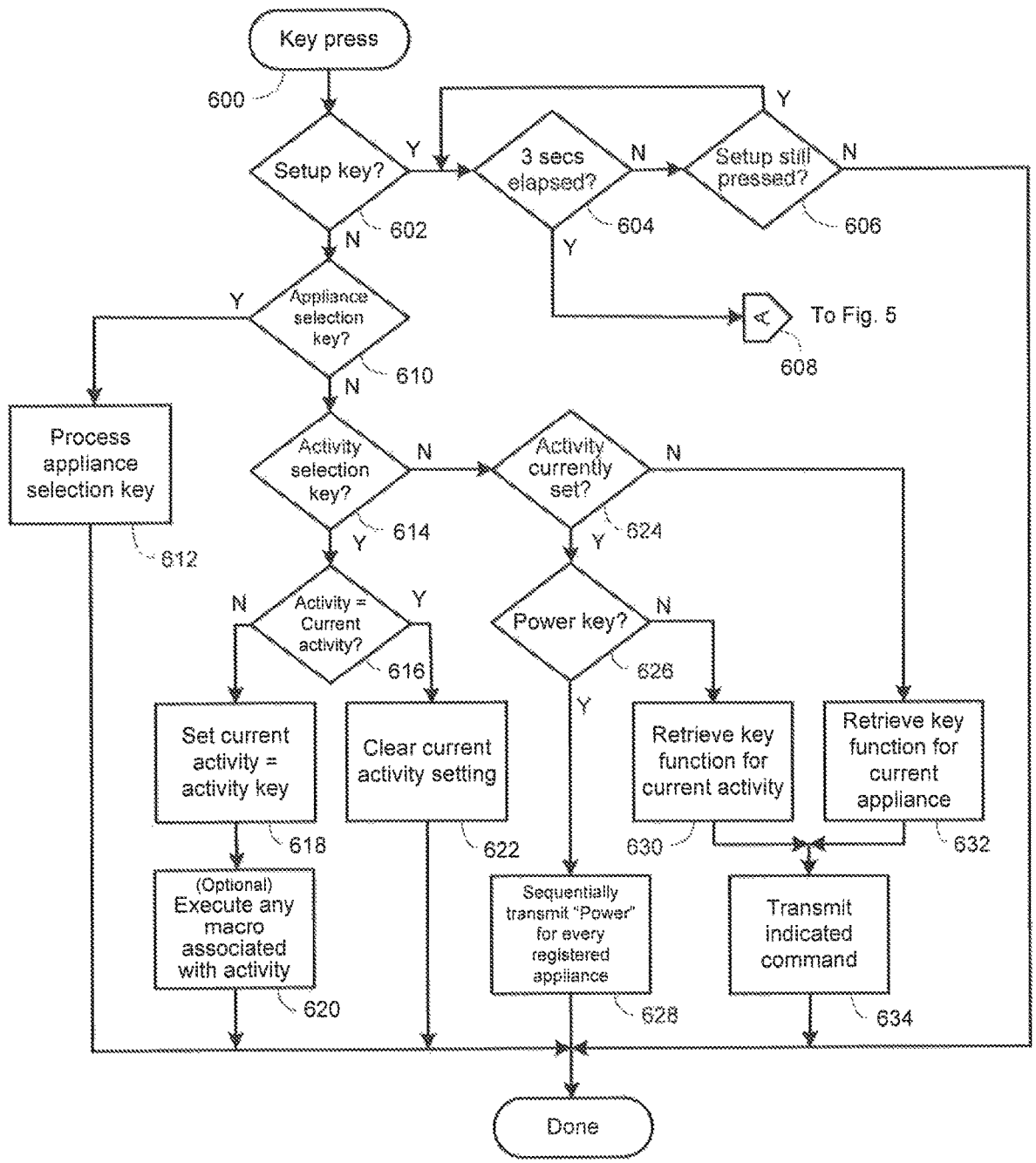
FIG. 6 illustrates the operation of an exemplary controlling device with activity based configurations, in flowchart form.

Thus, in executing step 630 of FIG. 6, an exemplary controlling device operating program may use appliance registration data such as illustrated in table 400 to index into a table of appliance assignments such as illustrated in table 700 in order to determine which appliance command data to retrieve for transmission in response to activation of a function key. By way of specific example, if the "Volume up" key 242 of exemplary controlling device 100 were activated during a "Watch TV" activity, the appliance registration data from row 402 of table 400, i.e., "1100", would be matched against the index entries in columns 710 through 716 of table 700. In this regard, it will be appreciated that in some embodiments, certain index entries may be tagged as "don't care," i.e., do not participate in the matching process. For example, in a "Watch TV" activity, non-participation of the TV appliance may be deemed illogical and accordingly its status may appear as "don't care" as illustrated by column 710 of table 700. Taking such "don't care" entries into account, a match for the data value "1100" retrieved from table 400 would be found at row 702 of table 700, i.e., "x10x". Accordingly, the appliance to which volume control commands are to be directed is the TV, as designated at column 720 row 702. The exemplary controlling device operating program may thus retrieve the command data corresponding to "TV volume up" from the command data library and cause this to be transmitted to appliance 102 at step 634. In some embodiments, the controlling device keys corresponding to the appliance and activity (if set) may be illuminated during transmission as feedback to the user, for example in the above presented case, keys 202 and 212 may be illuminated during transmission of the "volume up" command.

As an additional convenience, in certain embodiments the operating software of controlling device 100 may provide for user initiated modification of the assignment of appliances to logical key groups subsequent to the configuration of an activity. As will be appreciated, this may take the form of a permanent modification, for example by alteration of the contents of one or more of the illustrative tables of FIG. 7, or may take the form of a temporary modification, for example by creation of a working copy of one or more of the illustrative tables of FIG. 7 whilst retaining the original assignments unchanged and available for restoration via a reset operation if desired. By way of specific example, actuating and holding down an appliance selection key together with a function key representative of one of the logical key groups for a predetermined period of time may result in the assignment of the appliance corresponding to the held appliance selection key to the key group corresponding to the held function key for the activity mode currently set as active. In this context other methods of assigning or reassigning appliances to functional key groups as are known in the art may also be used, by way of example without limitation, as described in U.S. Pat. No. 7,013,434 or 6,947,101 both of like assignee and incorporated herein in their entirety.

While various concepts have been described in detail, it will be appreciated by those skilled in the art that various modifications and alternatives to those concepts could be developed in light of the overall teachings of the disclosure. Further, while described in the context of functional modules and illustrated using block diagram format, it is to be understood that, unless otherwise stated to the contrary, one or more of the described functions and/or features may be integrated in a single physical device and/or a software module, or one or more functions and/or features may be implemented in separate physical devices or software modules. It will also be appreciated that a detailed discussion of the actual implementation of each module is not necessary for an enabling understanding of the invention. Rather, the actual implementation of such modules would be well within the routine skill of an engineer, given the disclosure herein of the attributes, functionality, and inter-relationship of the various functional modules in the system. Therefore, a person skilled in the art, applying ordinary skill, will be able to practice the invention set forth in the claims without undue experimentation. It will be additionally appreciated that the particular concepts disclosed are meant to be illustrative only and not limiting as to the scope of the invention which is to be given the full breadth of the appended claims and any equivalents thereof.

All patents cited within this document are hereby incorporated by reference in their entirety.

What is claimed is:

1. A controlling device, comprising:
a processing device;
a transmitting device;
a plurality of input elements; and
a memory in which is stored a plurality of predetermined appliance to logical group of input elements mappings for a controllable activity and instructions executable by the processing device;
wherein the instructions, when executed by the processing device, cause the controlling device to receive, via one or more activations of predetermined ones of the plurality of input elements, input to designate a plurality of one or more appliances in an intended target appliances to controllable activity assignment, use the intended target appliances to controllable activity assignment as designated by the input to select one of the plurality of predetermined appliance to logical group of input elements mappings from memory, and use, as a function of the selected one of the plurality of predetermined appliance to logical group of input elements mappings, an appliance command data set that is appropriate for use in controlling functional operations of a one of the plurality of designated appliances when the controlling device is caused to transmit, via use of the transmitting device, command data in response to an activation of a one of the plurality of input elements that is within a logical group of input elements when the controlling device is placed into the activity mode corresponding to the controllable activity.

2. The controlling device as recited in claim 1, wherein the instructions, when executed by the processing device, further cause the controlling device to be placed into the activity mode corresponding to the controllable activity in response to activation of a further predetermined one of the plurality of input elements.

3. The controlling device as recited in claim 1, wherein the instructions, when executed by the processing device, further cause the controlling device to be placed into a configuration state wherein the one or more activations of predetermined input elements of the controlling device function to designate one or more of the plurality of appliances in the intended target appliances to controllable activity assignment.

4. The controlling device as recited in claim 3, wherein an activation of a further predetermined one of the plurality of input elements for a predetermined period of time causes the instruction, when executed by the processing device, to place the controlling device into the configuration state.

5. The controlling device as recited in claim 1, wherein the instructions, when executed by the processing device, further cause one or more of the predetermined input elements to be illuminated to indicate appliances in the intended target appliances to controllable activity assignment.

6. The controlling device as recited in claim 1, wherein the plurality of input elements comprises a plurality of hard keys.

7. The controlling device as recited in claim 1, wherein the plurality of predetermined appliance to logical group of input elements mappings includes plural mappings wherein an appliance is mapped to each one a first logical group of input elements associated with volume control functions, a second logical group of input elements associated with channel control functions, a third logical group of input elements associated with media playback functions, and a fourth logical group of input elements associated with menu navigation functions.

8. The controlling device as recited in claim 1, wherein the plurality of appliances in the intended target appliances to controllable activity assignment includes at least one default appliance that was pre-configured in the intended target appliances to controllable activity assignment.

9. The controlling device as recited in claim 1, wherein the plurality of predetermined appliance to logical group of input elements mappings is maintained in a table stored in the memory.

10. The controlling device as recited in claim 9, wherein the instructions, when executed by the processing device, use the intended target appliances to controllable activity assignment to access the table stored in memory to thereby select one of the plurality of predetermined appliance to logical group of input elements mappings when the controlling device is placed into the activity mode corresponding to the controllable activity.

11. The controlling device as recited in claim 2, wherein the instructions, when executed by the processing device, further cause the controlling device to execute a macro command sequence in response to the activation of the further predetermined one of the plurality of input elements.

12. A controlling device, comprising:
a processing device;
a transmitting device;
a plurality of input elements; and
a memory in which is stored a plurality of predetermined appliance to logical group of input elements mappings for a controllable activity and instructions executable by the processing device;
wherein the instructions, when executed by the processing device, cause the controlling device to receive, via one or more activations of predetermined ones of the plurality of input elements, input to designate a plurality of one or more appliances in an intended target appliances to controllable activity assignment, use the intended target appliances to controllable activity assignment as designated by the input to select one of the plurality of predetermined appliance to logical group of input elements mappings from memory, and use, as a function of the selected one of the plurality of predetermined appliance to logical group of input elements mappings, an appliance command data set that is appropriate for use in controlling functional operations of a one of the plurality of designated appliances when the controlling device is caused to transmit, via use of the transmitting device, command data in response to an activation of a one of the plurality of input elements that is dedicated to controlling power operations of one or more appliances when the controlling device is placed into the activity mode corresponding to the controllable activity.

13. The controlling device as recited in claim 12, wherein the predetermined input elements of the controlling device comprise appliance selection input elements of the controlling device.

14. The controlling device as recited in claim 12, wherein the instructions, when executed by the processing device, further cause the controlling device to illuminate one or more of the predetermined input elements to indicate appliances in the intended target appliances to controllable activity assignment.

15. The controlling device as recited in claim 14, wherein the predetermined input elements of the controlling device comprise appliance selection input elements of the controlling device.

* * * * *